United States Patent
Wong

(10) Patent No.: US 8,981,878 B2
(45) Date of Patent: Mar. 17, 2015

(54) CAVITY FILTER WITH RESILIENT MEMBER CONNECTED BETWEEN SLIDER AND DRIVING DEVICE

(71) Applicant: Hon Hai Precision Industry Co., Ltd., New Taipei (TW)

(72) Inventor: Kwo-Jyr Wong, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 233 days.

(21) Appl. No.: 13/756,622

(22) Filed: Feb. 1, 2013

(65) Prior Publication Data

US 2013/0234807 A1    Sep. 12, 2013

(30) Foreign Application Priority Data

Mar. 9, 2012   (CN) .................. 2012 2 0089237 U

(51) Int. Cl.
*H01P 1/20* (2006.01)
*H01P 1/207* (2006.01)
*H01P 1/208* (2006.01)
*H03J 3/00* (2006.01)

(52) U.S. Cl.
CPC ................ *H01P 1/207* (2013.01); *H01P 1/208* (2013.01); *H03J 3/00* (2013.01)
USPC .......................................... 333/203; 333/207

(58) Field of Classification Search
USPC .................................. 333/208, 209, 202, 207
See application file for complete search history.

(56) References Cited

U.S. PATENT DOCUMENTS 8,294,536 B2 *   10/2012   Wong ............................ 333/203
2014/0292445 A1 *   10/2014   Wong ............................ 333/203

* cited by examiner

*Primary Examiner* — Dinh Le
(74) *Attorney, Agent, or Firm* — Novak Druce Connolly Bove + Quigg LLP

(57) ABSTRACT

A cavity filter includes a slider, a driving device, an adapter and a resilient member. The slider is used to slide relative to and couple with a plurality of resonators located in the cavity filter to change a resonating frequency of the cavity filter. The driving device is used to drive the slider slide relative to the plurality of resonators. The adapter is installed between the slider and the driving device. The resilient member is elastically connected between the slider and the adapter and used to absorb vibrations of the driving device to make the slider move on an even keel.

16 Claims, 6 Drawing Sheets

CAVITY FILTER WITH RESILIENT MEMBER CONNECTED BETWEEN SLIDER AND DRIVING DEVICE

BACKGROUND

1. Technical Field

The disclosure relates to cavity filters, and more particularly relates to a connecting structure between a slider and a driving device in a cavity filter.

2. Description of Related Art

Cavity filters are popularly used in mobile communications. Generally, a cavity filter comprises a shell, a slider, a plurality of resonators, and a motor. The slider is movably connected to the shell and opposite to the plurality of resonators arranged in the shell. The motor drives the slider to move relative to the shell and couples with the resonators to adjust resonating frequency of the cavity filter. Generally, the slider is fixed to the motor by fasteners, such as screws. However, vibration of the motor causes the slider to vibrate, which makes the slider not able to move on an even keel, thereby reducing efficiency of adjusting the resonating frequency of the cavity filter.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
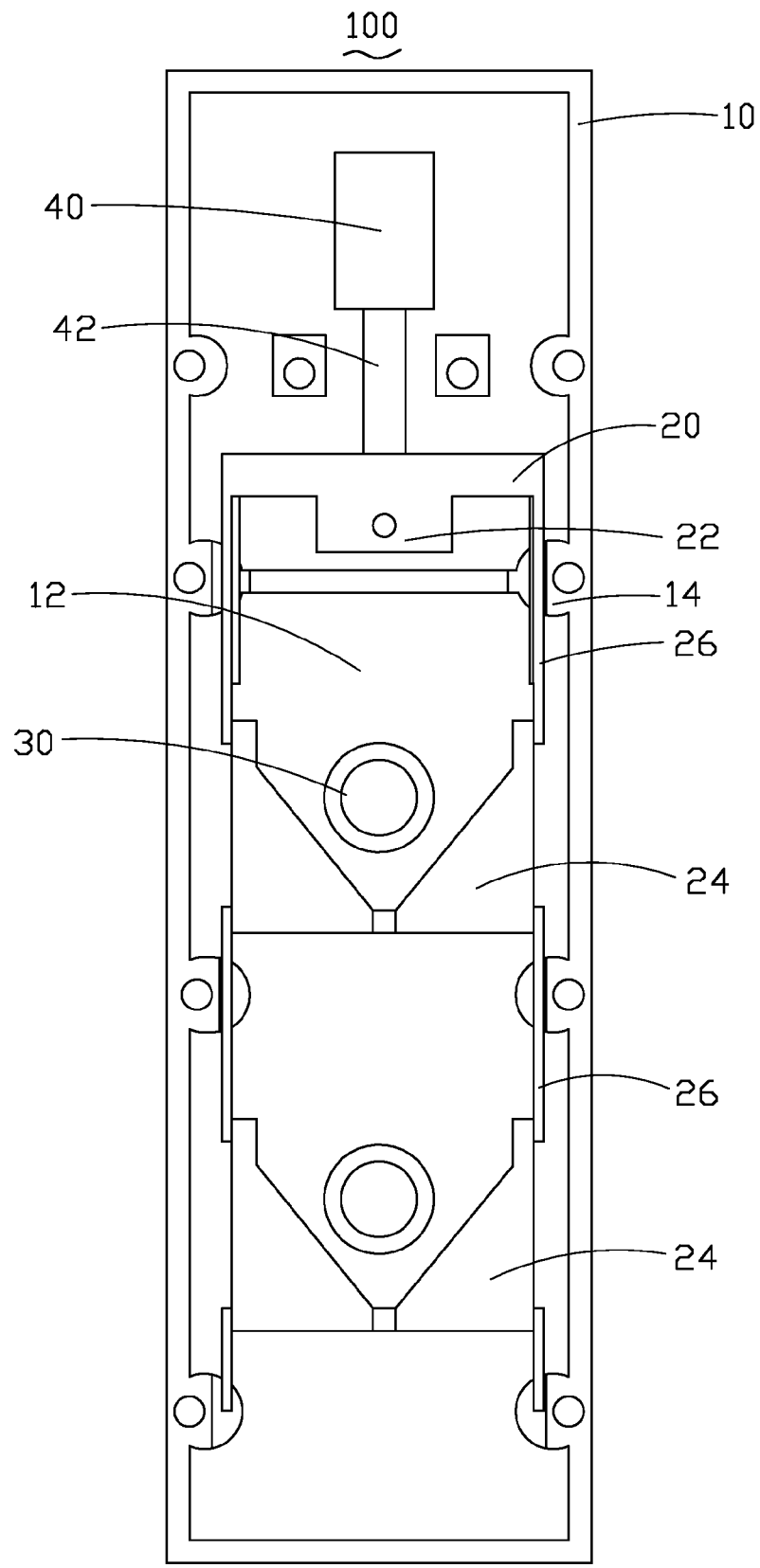
FIG. 1 is a schematic diagram of a cavity filter in accordance with a first exemplary embodiment of the disclosure, in which a plurality of resonators, a driving device, and a slider are secured in a shell of the cavity filter.
Figure 2:
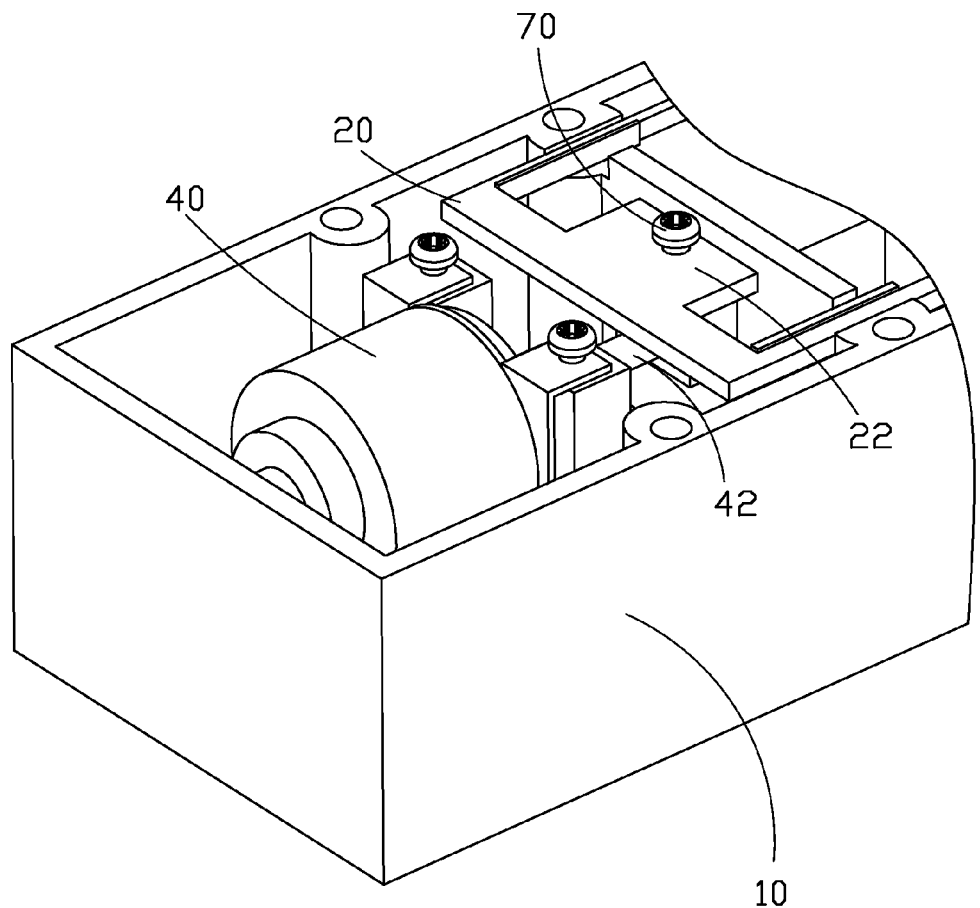
FIG. 2 is a partially perspective view of FIG. 1.
Figure 3:
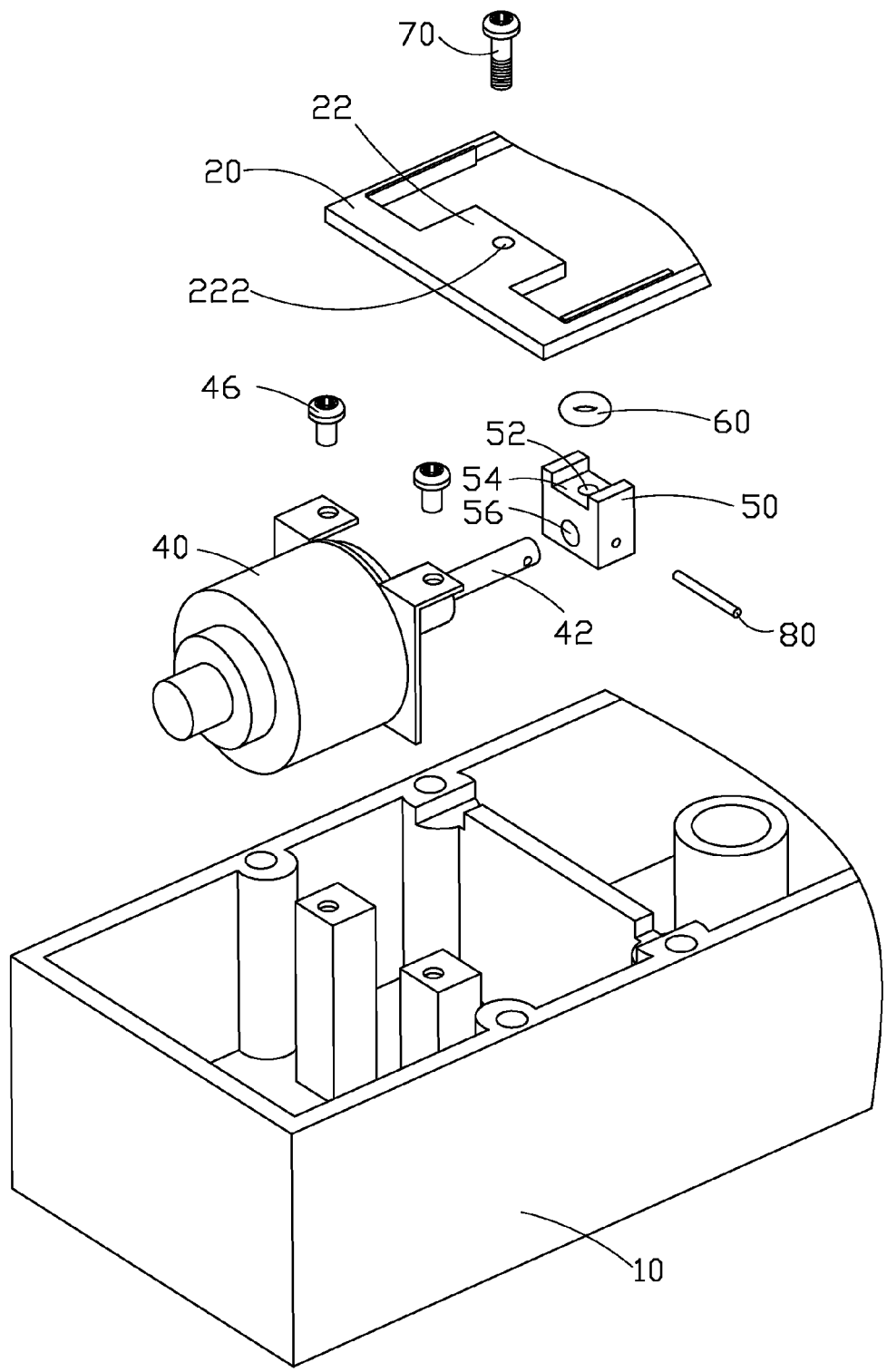
FIG. 3 is a disassembled perspective view of FIG. 2.

In FIGS. 1-3, the cavity filter 100 comprises a shell 10, a slider 20, a plurality of resonators 30 secured in the shell 10, a driving device 40 for driving the slider 20 to slide relative to and couple with the resonators 30 to change a resonating frequency of the cavity filter 100, an adapter 50 and a resilient member 60. The cavity filter 100 defines a cavity 12 surrounded by the shell 10. The shell 10 comprises a plurality of positioning portions 14 arranged in two rows opposite to each other. The plurality of resonators 30 are arranged in the cavity 12 and fixed to the shell 10. In this embodiment, the plurality of resonators 30 are arranged in a row and located between the two rows of the positioning portions 14. The slider 20 comprises a fixing portion 22, a plurality of tuning portions 24 and a plurality of connecting portions 26. The fixing portion 22 is configured at one end of the slider 20 close to the driving device 40. The plurality of tuning portions 24 are respectively opposite to the resonators 30. In this embodiment, the cavity filter 100 includes two resonators 30; accordingly, the slider 20 includes two tuning portions 24 respectively positioned above the resonators 30. The plurality of connecting portions 26 arranged in two rows opposite to each other are positioned on the two rows of the positioning portions 14. Two of the connecting portions 26 are connected between the fixing portion 22 and one of the resonators 30 adjacent to the fixing portion 22, and others of the connecting portions 26 are connected between the resonators 30.

The driving device 40 is fixed in the shell 10 by screws 46 and comprises a shaft 42 parallel to the slider 20. In assembly, the fixing portion 22 is located above the shaft 42. The adapter 50 is installed between the fixing portion 22 and the shaft 42. In this embodiment, the driving device 40 is a step motor, but the disclosure is not limited thereto. When the driving device 40 is powered on, the shaft 42 moves along an axial direction of the shaft 42, thereby the slider 20 move on the plurality of positioning portions 14 and coupling with the resonators 30 to change a resonating frequency of the cavity filter 100. Vibrations of the shaft 42 along a radial direction are created during moving of the shaft 42. The shaft 42 is fixed to the adapter 50. The resilient member 60 is elastically connected between the slider 20 and the adapter 50. When the driving device 40 is powered on, the resilient member 60 absorbs the vibrations of the shaft 42, thereby the slider 20 can move on an even keel on the plurality of positioning portions 14 without vibrations. That is the slider 20 is snugly supported on the plurality of positioning portions 14 constantly during moving. Furthermore, the resilient member 60 is capable of absorbing a positioning error between the shaft 42 and the adapter 50, that is, if the shaft 42 is not be entirely parallel to a substantially horizontal plane due to the positioning error between the shaft 42 and the adapter 50, the slider 20 can still be positioned in the substantially horizontal plane on the plurality of portions 14 due to the resilient member 60 can adjust the situation of the slider 20.

In this embodiment, the fixing portion 22 of the slider 20 defines a through hole 222. The adapter 50 defines a screw hole 52 opposite to the through hole 222. In assembly, the resilient member 60 is clamped between the adapter 50 and the fixing portion 22 of the slider 20, and a screw 70 passes through the through hole 222, the resilient member 60 and is screwed into the screw hole 52, thereby the slider 20 is connected to the adapter 50. The screw 70 engages with the through hole 222 with a clearance fit, that is, the screw 70 is capable of moving in the through hole 222 freely under an external force.

Figure 4:
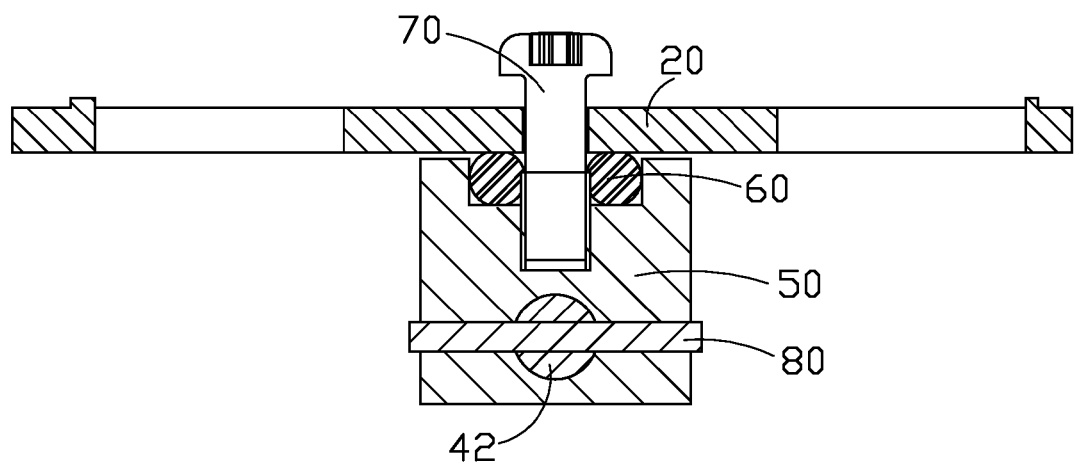
FIG. 4 is a cross sectional view of the cavity filter in accordance with a first exemplary embodiment of the disclosure, showing connecting structure between the slider and the driving device.

FIG. 4 is a cross sectional view of the cavity filter 100 in accordance with a first exemplary embodiment. The resilient member 60 is a rubber ring coiled around the screw 70 to be positioned between the slider 20 and the adapter 50. In assembly, the fixing portion 22 of the slider 20 is supported on the resilient member 60. That is, the adapter 50 is entirely separated from the fixing portion 22 with a gap configured between the fixing portion 22 and the adapter 50. The adapter 50 defines a receiving groove 54 opened toward the fixing portion 22, as shown in FIG. 3. The screw hole 52 is configured on a bottom of the receiving groove 54 opposite to the fixing portion 22. The resilient member 60 is partially received in the receiving groove 54. Top of the resilient member 60 is exposed outside of the receiving groove 54 and contacts with the fixing portion 22.

Figure 5:
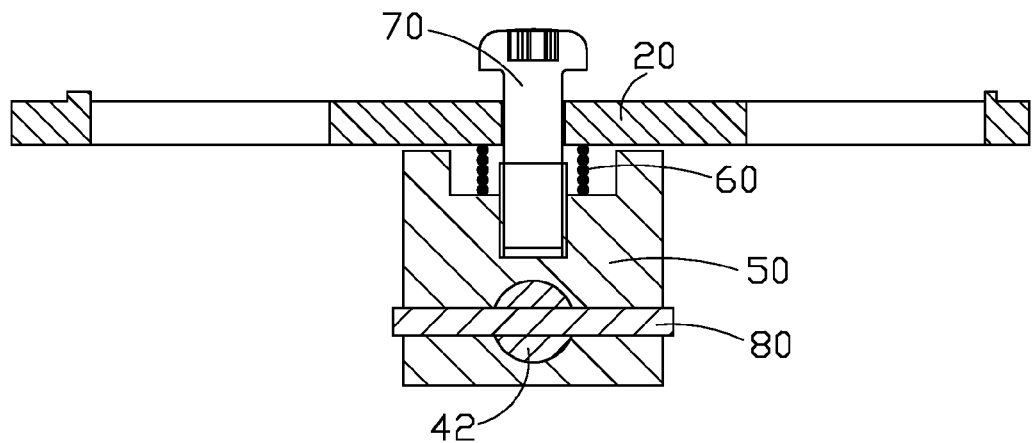
FIG. 5 is a cross sectional view of the cavity filter in accordance with a second exemplary embodiment of the disclosure, showing connecting structure between the slider and the driving device.

FIG. 5 is a cross sectional view of the cavity filter 100 in accordance with a second exemplary embodiment. In this embodiment, the adapter 50 has a same structure with that of the first exemplary embodiment. Difference between the first and the second exemplary embodiments is the structure of the resilient member 60. In this embodiment, the resilient member 60 is a compression spring coiled around the screw 70.

Figure 6:
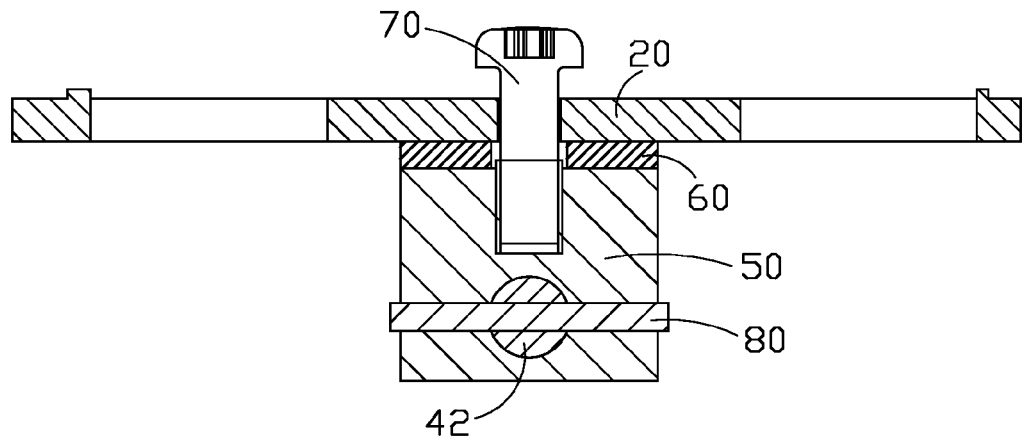
FIG. 6 is a cross sectional view of the cavity filter in accordance with a third exemplary embodiment of the disclosure, showing connecting structure between the slider and the driving device.

FIG. 6 is a cross sectional view of the cavity filter 100 in accordance with a third exemplary embodiment. In this embodiment, the resilient member 60 is a compressible cushion or a spring washer. The resilient member 60 is attached on the adapter 50 by an adhesive, such as glue, to support the slider 20.

The adapter 50 defines an installing hole 56 opened toward the shaft 42 of the driving device 40, as shown in FIG. 3. In assembly, the shaft 42 is inserted into the installing hole 56 and fixed to the adapter 50 by a pin 80 passing through the adapter 50 and the shaft 42 with a tight fit.

The resilient member 60 absorbs the vibrations of the shaft 42 along the radial direction due to elastic potential energy of the resilient member 60. Therefore, the slider 20 can move on an even keel to improve efficiency of adjusting the resonating frequency of the cavity filter 100.

While the exemplary embodiments have been described, it should be understood that it has been presented by way of example only and not by way of limitation. The breadth and scope of the disclosure should not be limited by the described exemplary embodiments, but only in accordance with the following claims and their equivalent.

What is claimed is:

1. A cavity filter, comprising:
    a slider, sliding relative to and coupled with a plurality of resonators located in the cavity filter to change a resonating frequency of the cavity filter;
    a driving device, driving the slider to slide relative to the plurality of resonators;
    an adapter, installed between the slider and the driving device; and
    a resilient member, elastically connected between the slider and the adapter;
    wherein when the driving device is powered on, the resilient member absorbs vibrations of the driving device to make the slider move on an even keel.

2. The cavity filter as claimed in claim 1, wherein the driving device is a step motor.

3. The cavity filter as claimed in claim 2, wherein the driving device comprises a shaft, the adapter defines an installing hole, the shaft is inserted into the installing hole and fixed to the adapter by a pin passing through the adapter and the shaft with a tight fit.

4. The cavity filter as claimed in claim 1, wherein the slider defines a through hole, the adapter defines a screw hole opposite to the through hole, a screw passes through the through hole, the resilient member and is screwed into the screw hole, the screw engages with the through hole with a clearance fit.

5. The cavity filter as claimed in claim 4, wherein the resilient member is a rubber ring coiled around the screw and clamped between the slider and the adapter.

6. The cavity filter as claimed in claim 4, wherein the resilient member is a compression spring coiled around the screw and clamped between the slider and the adapter.

7. The cavity filter as claimed in claim 4, wherein the resilient member is a compressible cushion or a spring washer stuck on the adapter to support the slider.

8. The cavity filter as claimed in claim 4, wherein the adapter defines a receiving groove opened toward the slider, the screw hole is configured on a bottom of the receiving groove, the resilient member is partially received in the receiving groove.

9. A cavity filter, comprising:
    a shell, comprising a plurality of positioning portions arranged in two rows opposite to each other;
    a plurality of resonators, fixed in the shell and arranged in a row and locked between the two rows of the positioning portions;
    a slider, positioned on the plurality of positioning portions, and comprising a plurality of tuning portions located above the plurality of resonators and used to couple to the plurality of resonators to change a resonating frequency of the cavity filter;
    a driving device, driving the slider slide relative to the plurality of resonators;
    an adapter, installed between the slider and the driving device; and
    a resilient member, elastically connected between the slider and the adapter;
    wherein when the driving device is powered on, the resilient member absorbs vibrations of the driving device to make the slider move on an even keel.

10. The cavity filter as claimed in claim 9, wherein the driving device is a step motor.

11. The cavity filter as claimed in claim 10, wherein the driving device comprises a shaft, the adapter defines an installing hole, the shaft is inserted into the installing hole and fixed to the adapter by a pin passing through the adapter and the shaft with a tight fit.

12. The cavity filter as claimed in claim 9, wherein the slider defines a through hole, the adapter defines a screw hole opposite to the through hole, a screw passes through the through hole, the resilient member and is screwed into the screw hole, the screw engages with the through hole with a clearance fit.

13. The cavity filter as claimed in claim 12, wherein the resilient member is a rubber ring coiled around the screw and clamped between the slider and the adapter.

14. The cavity filter as claimed in claim 12, wherein the resilient member is a compression spring coiled around the screw and clamped between the slider and the adapter.

15. The cavity filter as claimed in claim 12, wherein the resilient member is a compressible cushion or a spring washer stuck on the adapter to support the slider.

16. The cavity filter as claimed in claim 12, wherein the adapter defines a receiving groove opened toward the slider, the screw hole is configured on a bottom of the receiving groove, the resilient member is partially received in the receiving groove.

* * * * *